United States Patent [19]
Mikubo

[11] Patent Number: 6,014,314
[45] Date of Patent: Jan. 11, 2000

[54] PACKAGE STRUCTURE OF A MULTI-CHIP MODULE

[75] Inventor: Kazuyuki Mikubo, Tokyo, Japan

[73] Assignee: NEC Corporation, Tokyo, Japan

[21] Appl. No.: 09/079,385

[22] Filed: May 15, 1998

[30] Foreign Application Priority Data

May 15, 1997 [JP] Japan .................................... 9-125576

[51] Int. Cl.$^7$ ...................................................... H05K 7/20
[52] U.S. Cl. ......................... 361/704; 361/707; 361/710; 361/720; 257/717; 29/832; 174/252; 165/80.3
[58] Field of Search ............................ 361/688, 704–717, 361/719–720, 749, 769, 783; 257/706–723, 697, 686, 726–727; 165/80.2, 80.3; 174/252; 29/832, 843

[56] References Cited

U.S. PATENT DOCUMENTS

5,089,936  2/1992  Kojima et al. ............................ 361/387
5,375,039  12/1994  Wiesa ...................................... 361/720

*Primary Examiner*—Donald Sparks
*Assistant Examiner*—Michael Datskovsky
*Attorney, Agent, or Firm*—Young & Thompson

[57] ABSTRACT

A semiconductor package structure comprising the following elements. A printed board has a first surface on which a plurality of first heat-conductive patterns are provided and a second surface on which a plurality of second heat-conductive patterns are provided. The printed board has heat-conductive through holes connecting the first and second heat-conductive patterns. A multi-chip module has a plurality of semiconductor packages and is provided on the first surface of the printed board. A plurality of heat-conductive supporting members are provided on the first heat-conductive patterns. A heat radiator structure is provided which has at least two heat radiation fins and at least a heat radiation groove defined by the heat radiation fins. The heat radiator structure is provided on the multi-chip module. A plurality of heat conductivity plate-shaped members are fixed to the heat-conductive supporting members and inserted into the heat radiation groove so that the heat conductivity plate-shaped members are in contact with upper surfaces of the heat radiation fins. A first heat transfer route is formed for transferring a heat generated in the multi-chip module through the heat radiator structure to atmosphere surrounding the heat radiator structure. A second heat transfer route is formed for transferring the heat through the heat radiator structure, the heat conductivity plate-shaped members, the heat-conductive supporting members and the first heat-conductive patterns to the printed board and also to the through holes which are heat-conductive to the second heat-conductive patterns. A third heat transfer route is formed for transferring the heat to the printed board.

10 Claims, 5 Drawing Sheets

PACKAGE STRUCTURE OF A MULTI-CHIP MODULE

BACKGROUND OF THE INVENTION

The present invention relates to a package structure of a multi-hip module and more particularly to a package structure with a heat transfer structure of a multi-hip module having a plurality of highly heat-generating semiconductor devices with high speed performances for use in an electronic device such as note-type personal computers.

Figure 1:
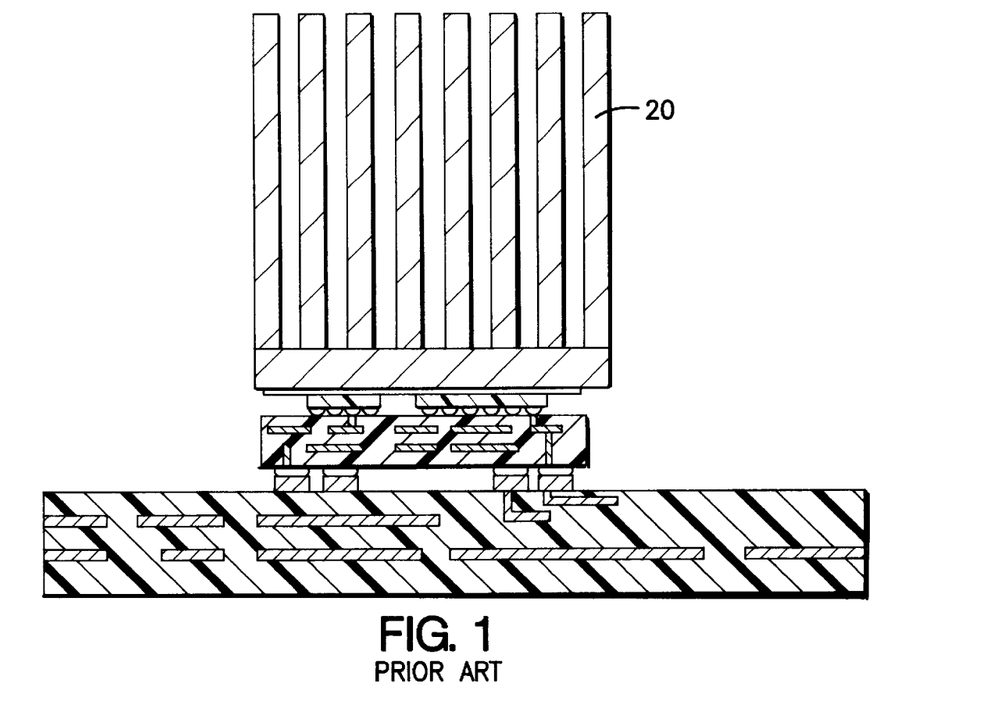
FIG. 1 is a cross sectional elevation view illustrative of a conventional semiconductor packaging structure with a high heat transfer structure on which a heat sink is provided.

In recent years, there has been required scaling down and reduction in weight of electronic devices packaging high speed and high level function semiconductor devices, typically note type personal computers. Satisfactions to those requirements for scaling down and reduction in weight of electronic devices packaging high speed and high level function semiconductor devices raises a serious and practical problem with how to transfer or radiate generated heat to outside of the electronic devices. The packaging structure of the semiconductor devices is important for efficiently transferring and radiating the generated heat to outside of the electronic devices In prior art, various types of semiconductor packaging structures had been proposed. FIG. 1 is a cross sectional elevation view illustrative of a conventional semiconductor packaging structure with a high heat transfer structure on which a heat sink 20 is provided. Another conventional semiconductor packaging structure has a micro-fun with a heat sink for compulsory air-cooling system. Still another conventional semiconductor packaging structure has a combination of a heat pipe and a micro-fun.

Yet another heat transfer structure is disclosed in Japanese laid-open patent publication No. 5-95060, wherein a circuit board is fixed with a fixed type spring metal part which is formed with a cleaved groove and a recessed portion. Heat radiation fins are slid into the grooves so that the heat radiation fin is held over the semiconductor device by a surface contact and a proper tension by a spring force.

Further another heat transfer structure is disclosed in Japanese laid-open patent publication No. 4-10558, wherein a quad flat package is tightly covered with and surrounded by a corrugate-shaped metal heat radiation plate so that the quad flat package is caulked by the corrugate-shaped metal heat radiation plate.

Furthermore another heat transfer structure is disclosed in Japanese laid-open patent publication No. 6-21277, wherein a heat radiation plate is provided in a gap between a semiconductor package of pin grid array or quad flat package and a printed wiring board for heat transfer from the semiconductor package through the heat radiation plate to the printed wring board.

If the heat sink or the micro-fun is provided over the semiconductor package under the requirement for reduction in height and scaling down of the electronic device such as note type personal computers, then the heat sink and the micro-fun are limited in height whereby the heat radiation effect is reduced. Such the heat radiation structure is not responsible to high power electronic devices such as advanced semiconductor devices with high speed performance. Further, an excess mechanical stress is applied onto the semiconductor device when the heat sink is provided on the semiconductor package. The other heat transfer structure using the heat pipe is engaged with another problem with increased cost of the electronic device.

The above conventional heat transfer structure disclosed in Japanese laid-open patent publication No. 5-95060 is engaged with the following problem. The heat generated from the semiconductor device is transferred from the radiation fins by air-convection current. It is difficult to transfer a large amount of heat generated. Further, the spring metal fitting is pressed onto the semiconductor device and the spring metal fitting is fixed to the printed board, for which reason although it is possible to prevent the application of the excess thermal stress onto the semiconductor device, it is difficult for the fixed type spring metal fittings to make uniform the pressing forces to metal bumps. This means that the excess thermal stress is likely to be applied to the semiconductor device or the printed board.

The above conventional heat transfer structure disclosed in Japanese laid-open patent publication No. 4-10558 is engaged with the following problem. It is difficult to adjust a pressing force between the heat radiator and the quad flat package. Cracking and braking are likely to be caused at stress singular point of the heat radiator and the quad flat package. Further, cracking is also likely to be caused at a cramped portion of the printed board.

The above conventional heat transfer structure disclosed in Japanese laid-open patent publication No. 6-21277 is engaged with the following problem. A heat radiation effect or a heat radiation efficiency is insufficient because the heat generated is transferred through the contact surface between the substrate and the heat conductive material.

In the above circumstances, it had been required to develop a novel heat transfer structure of a semiconductor package for multi-chip module.

SUMMARY OF THE INVENTION

Accordingly, it is an object of the present invention to provide a novel package structure with a heat transfer structure for a multi-hip module free from the above problems.

It is a further object of the present invention to provide a novel package structure with a heat transfer structure of a multi-hip module applicable to thin electronic devices such as note type personal computers.

It is a still further object of the present invention to provide a novel package structure with a heat transfer structure of a multi-hip module which is superior in heat radiation capability.

It is yet a further object of the present invention to provide a novel package structure with a heat transfer structure of a multi-hip module allowing reduction in packaging cost.

It is a further more object of the present invention to provide a novel package structure with a heat transfer structure of a multi-hip module which is superior in electric performance and characteristic.

The above and other objects, features and advantages of the present invention will be apparent from the following descriptions.

The present invention provides a semiconductor package structure comprising the following elements. A printed board has a first surface on which a plurality of first heat-conductive patterns are provided and a second surface on which a plurality of second heat-conductive patterns are provided. The printed board has heat-conductive through holes connecting the first and second heat-conductive patterns. A multi-chip module has a plurality of semiconductor packages and is provided on the first surface of the printed board. A plurality of heat-conductive supporting members are provided on the first heat-conductive patterns. A heat radiator structure is provided which has at least two heat radiation fins and at least a heat radiation groove defined by the heat radiation fins. The heat radiator structure is provided on the multi-chip module. A plurality of heat conductivity plate-shaped members are fixed to the heat-conductive supporting members and inserted into the heat radiation groove so that the heat conductivity plate-shaped members are in contact with upper surfaces of the heat radiation fins. A first heat transfer route is formed for transferring a heat generated in the multi-chip module through the heat radiator structure to atmosphere surrounding the heat radiator structure. A second heat transfer route is formed for transferring the heat through the heat radiator structure, the heat conductivity plate-shaped members, the heat-conductive supporting members and the first heat-conductive patterns to the printed board and also to the through holes which are heat-conductive to the second heat-conductive patterns. A third heat transfer route is formed for transferring the heat to the printed board.

BRIEF DESCRIPTION OF THE DRAWINGS

Preferred embodiments according to the present invention will be described in detail with reference to the accompanying drawings.

DISCLOSURE OF THE INVENTION

The first present invention provides a semiconductor package structure comprising the following elements. A printed board has a first surface on which a plurality of first heat-conductive patterns are provided and a second surface on which a plurality of second heat-conductive patterns are provided. The printed board has heat-conductive through holes connecting the first and second heat-conductive patterns. A multi-chip module has a plurality of semiconductor packages and is provided on the first surface of the printed board. A plurality of heat-conductive supporting members are provided on the first heat-conductive patterns. A heat radiator structure is provided which has at least two heat radiation fins and at least a heat radiation groove defined by the heat radiation fins. The heat radiator structure is provided on the multi-chip module. A plurality of heat conductivity plate-shaped members are fixed to the heat-conductive supporting members and inserted into the heat radiation groove so that the heat conductivity plate-shaped members are in contact with upper surfaces of the heat radiation fins. A first heat transfer route is formed for transferring a heat generated in the multi-chip module through the heat radiator structure to atmosphere surrounding the heat radiator structure. A second heat transfer route is formed for transferring the heat through the heat radiator structure, the heat conductivity plate-shaped members, the heat-conductive supporting members and the first heat-conductive patterns to the printed board and also to the through holes which are heat-conductive to the second heat-conductive patterns. A third heat transfer route is formed for transferring the heat to the printed board.

It is preferable to further provide a heat-conductive sheet between the multi-chip module and the heat radiator structure.

It is preferable that the heat conductivity plate-shaped members are capable of providing a spring force so that the heat conductivity plate-shaped members push the heat radiator structure downwardly. In this case, it is further preferable that the heat conductivity plate-shaped members have bent portions providing the spring force.

It is preferable to further provide spacers on the heat-conductive supporting members for adjusting positional levels of the heat conductivity plate-shaped members so that the heat conductivity plate-shaped members push the heat radiator structure downwardly.

The second present invention provides a semiconductor device comprising the following elements. A printed board has a first surface on which a plurality of first heat-conductive patterns are provided and a second surface on which a plurality of second heat-conductive patterns are provided. The printed board has heat-conductive through holes connecting the first and second heat-conductive patterns. A multi-chip module is provided which has a plurality of semiconductor packages and is provided on the first surface of the printed board. A plurality of heat-conductive pillars are provided on the first heat-conductive patterns. A heat radiator is provided which has at least two heat radiation fins and at least a heat radiation groove defined by the heat radiation fins. The heat radiator is provided on the multi-chip module. A plurality of heat conductivity plates are fixed to the heat-conductive pillars and inserted into the heat radiation groove so that the heat conductivity plates are in contact with upper surfaces of the heat radiation fins. A first heat transfer route is formed for transferring a heat generated in the multi-chip module through the heat radiator to atmosphere surrounding the heat radiator. A second heat transfer route is formed for transferring the heat through the heat radiator, the heat conductivity plates, the heat-conductive pillars and the first heat-conductive patterns to the printed board and also to the through holes which are heat-conductive to the second heat-conductive patterns. A third heat transfer route is formed for transferring the heat to the printed board.

It is preferable to further provide a heat-conductive sheet between the multi-chip module and the heat radiator.

It is preferable that the heat conductivity plates are capable of providing a spring force so that the heat conductivity plates push the heat radiator structure downwardly. In this case, it is further preferable that the heat conductivity plates have bent portions providing the spring force.

It is preferable to further provide spacers on. the heat-conductive pillars for adjusting positional levels of the heat conductivity plates so that the heat conductivity plates push the heat radiator structure downwardly.

Figure 2:
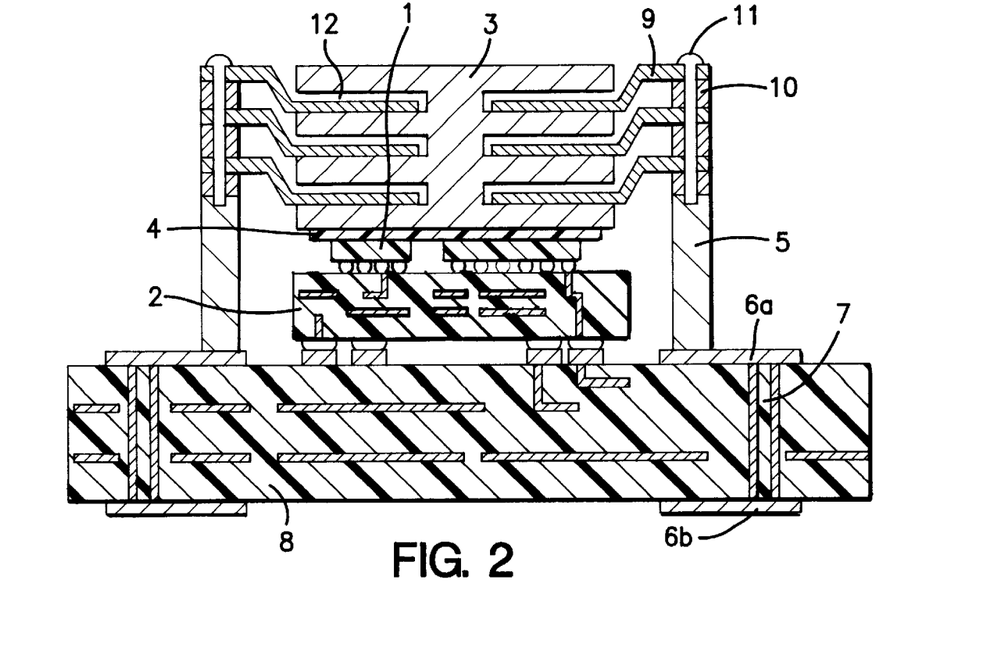
FIG. 2 is a cross sectional elevation view illustrative of a novel package structure with a heat transfer structure of a multi-chip module in a first embodiment in accordance with the present invention.
Figure 3:
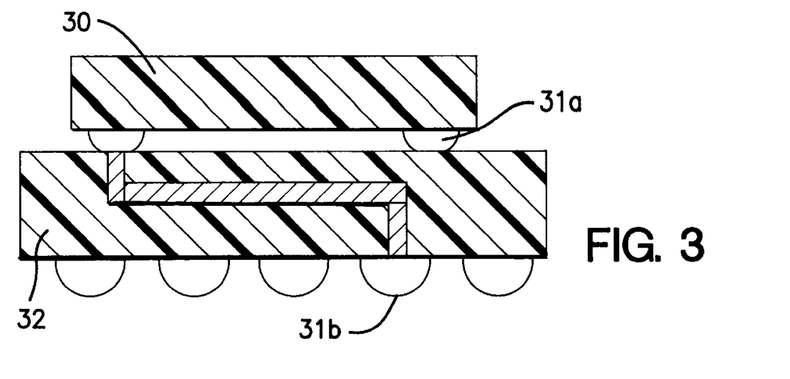
FIG. 3 is a cross sectional elevation view illustrative of a chip size package.
Figure 4A:
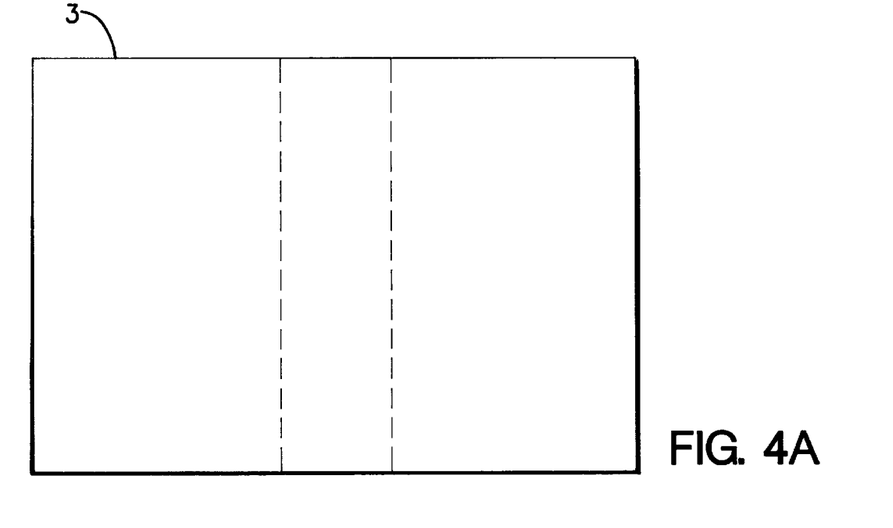
FIG. 4A is a plane view illustrative of a heat radiator used in a novel package structure with a heat transfer structure of a multi-chip module in a first embodiment in accordance with the present invention.
Figure 4B:
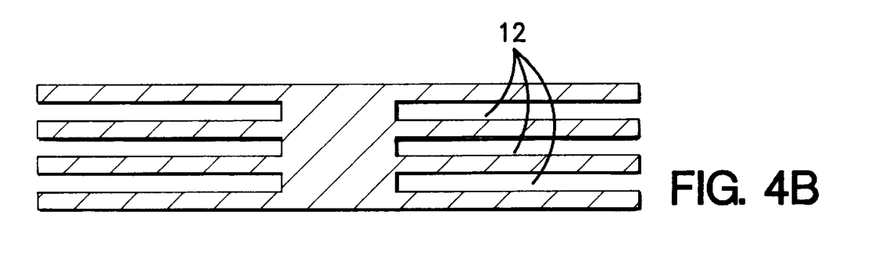
FIG. 4B is a cross sectional elevation view illustrative of a heat radiator used in a novel package structure with a heat transfer structure of a multi-chip module in a first embodiment in accordance with the present invention.
Figure 5A:
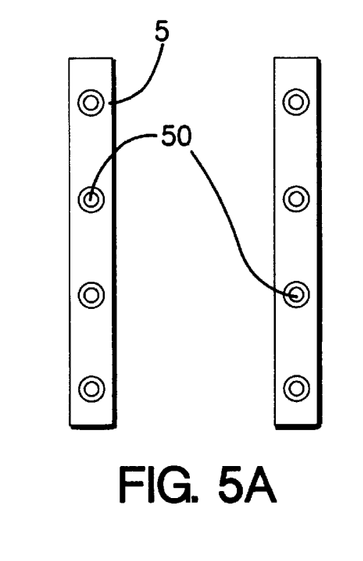
FIG. 5A is a plane view illustrative of a metal heat radiation pillar used in a novel package structure with a heat transfer structure of a multi-chip module in a first embodiment in accordance with the present invention.
Figure 5B:
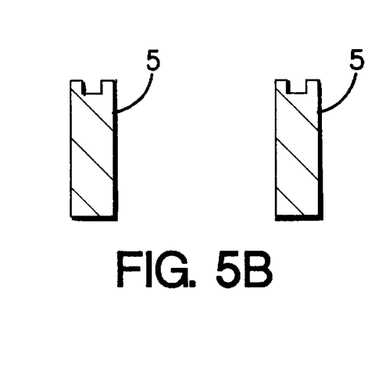
FIG. 5B is a cross sectional elevation view illustrative of a metal heat radiation pillar used in a novel package structure with a heat transfer structure of a multi-chip module in a first embodiment in accordance with the present invention.
Figure 6A:
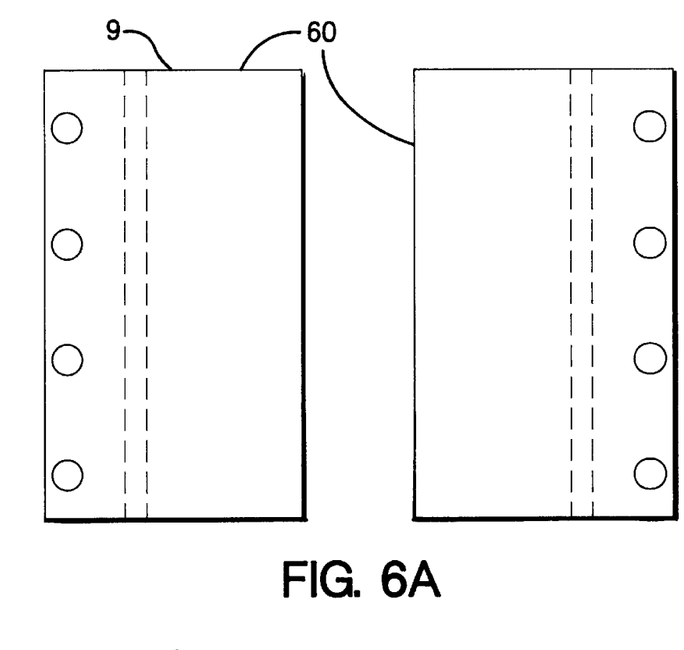
FIG. 6A is a plane view illustrative of a metal heat radiation plate used in a novel package structure with a heat transfer structure of a multi-chip module in a first embodiment in accordance with the present invention.
Figure 6B:
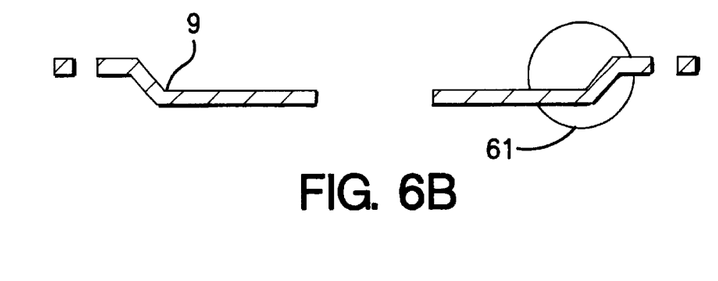
FIG. 6B is a cross sectional elevation view illustrative of a metal heat radiation plate used in a novel package structure with a heat transfer structure of a multi-chip module in a first embodiment in accordance with the present invention.

PREFERRED EMBODIMENTS
FIRST EMBODIMENT:

A first embodiment according to the present invention will be described in detail with reference to FIG. 2 which is a cross sectional elevation view illustrative of a novel package structure with a heat transfer structure of a multi-chip module. FIG. 4A is a plane view illustrative of a heat radiator used in a novel package structure with a heat transfer structure of a multi-chip module. FIG. 4B is a cross sectional elevation view illustrative of a heat radiator used in a novel package structure with a heat transfer structure of a multi-chip module. FIG. 5A is a plane view illustrative of a metal heat radiation pillar used in a novel package structure with a heat transfer structure of a multi-chip module. FIG. 5B is a cross sectional elevation view illustrative of a metal heat radiation pillar used in a novel package structure with a heat transfer structure of a multi-chip module. FIG. 6A is a plane view illustrative of a metal heat radiation plate used in a novel package structure with a heat transfer structure of a multi-chip module. FIG. 6B is a cross sectional elevation view illustrative of a metal heat radiation plate used in a novel package structure with a heat transfer structure of a multi-chip module. A printed wiring board 8 has front and back surfaces on which copper foil patterns for ground line and power supply and mounting pads are provided. Further, copper foil patterns 6a and 6b are provided on the front and back surfaces of the printed wiring board 8 so that metal heat radiation pillars 5 are mounted on the copper foil patterns 6a on the front surface of the printed wiring board 8. Through holes 7 are formed in the printed wiring board 8 so that the copper foil pattern 6a on the front surface of the printed wiring board 8 is connected through the copper foil pattern 6b on the back surface of the printed wiring board 8. This means that the copper foil pattern 6a on the front surface of the printed wiring board 8 is thermally conductive through the through hole 7 to the copper foil pattern 6b on the back surface of the printed wiring board 8. A chip size package mounting substrate 2 is mounted by bumps on the front surface of the printed wiring board 8. A plurality of chip size packages 1 are mounted on a front surface of the chip size package mounting substrate 2. Front surfaces of the chip size packages 1 face to the chip size package mounting substrate 2. A heat conductivity sheet 4 is provided over the plural chip size packages 1 wherein the back surfaces of the plural chip size packages 1 are adjacent to the heat conductivity sheet 4, whereby the heat conductivity sheet 4 compensates slight variation in thickness of the plural chip size packages 1. FIG. 3 is a cross sectional elevation view illustrative of a chip size package. A semiconductor device 30 is mounted by metal bumps 31a on a carrier substrate 32 which is mounted by metal bumps 31b on the chip size package mounting substrate 2. A multi-chip module is provided over the printed wiring board 8 wherein the multi-chip module comprises the chip size package mounting substrate 2 and the plural chip size packages 1 mounted by the metal bumps 31b on the chip size package mounting substrate 2. The carrier substrate 32 is mainly made of a glass ceramic having a thermal expansion coefficient which is close to that of the semiconductor device 30. The chip size package mounting substrate 2 has a thin film multi-level interconnection structure for allowing a high density packaging.

Referring back to FIG. 2, a metal heat radiator 3 is provided on the heat conductivity sheet 4. The metal heat radiator 3 is preferably made of aluminum or aluminum alloys due to high heat conductivity and light weight. It is also preferable for application to the extremely thin note type personal computers that the thickness or height of the metal heat radiator 3 is as thin as possible. The metal heat radiator 3 has four level heat radiation fins and three level heat radiation grooves 12 defined between the four level fins. Each of the heat radiation grooves 12 has a gap of about 0.5 millimeters. The four level heat radiation fins and three level heat radiation grooves 12 enlarge a surface area of the metal heat radiator 3 to increase the heat radiation efficiency. Metal heat radiation pillars 5 are sold-bonded on the copper foil patterns 6a on the front surface of the printed wiring board 8. Each of the metal heat radiation pillars 5 comprises a copper rod which has a high heat conductivity. The top portion of each of the metal heat radiation pillars 5 has a screw portion. Metal heat radiation plates 9 are further provided so that the metal heat radiation plates 9 are partially inserted into the three level heat radiation grooves 12. The thickness of the metal heat radiation plates 9 is slightly thinner than the gap of the heat radiation grooves 12. The metal heat radiation plates 9 have bent portions for exhibiting plate-spring force. The metal heat radiation plates 9 are also fixed to the metal heat radiation pillars 5 by screws 11. Height adjustment spacers 10 are also used to define the levels of the metal heat radiation plates 9 so that bent portions of the metal heat radiation plates 9 exhibit the plate-spring force which is applied downwardly to the metal heat radiator 3. The height adjustment spacers 10 are made of copper or aluminum which has a high heat conductivity.

The above novel package structure has three heat transfer routes. Namely, in the first heat transfer route, the heat generated from the semiconductor devices 30 is transferred through the heat conductivity sheet 4 to the metal heat radiator 3 for subsequent heat radiation to atmosphere. In the second heat transfer route, the heat generated from the semiconductor devices 30 is transferred through the heat conductivity sheet 4 to the metal heat radiator 3 and then further transferred through the metal heat radiation plates 9 and the metal heat radiation pillars 5 to the printed wiring board 8. In the third heat transfer route, the heat generated from the semiconductor devices 30 is transferred through the carrier substrates 32 and the metal bumps 31b to the chip size package mounting substrate 2 and then further transferred through the bumps to the printed wiring board 8.

Since the printed wiring board 8 has a large total area of the copper foil patterns which have the high heat conductivity, then the printed wiring board 8 has a heat conductivity which is higher by several tens time than a heat conductivity of the glass epoxy resin printed wiring board, for which reason it is effective to take place the heat radiation through the printed wiring board 8 Since, further, the copper foil patterns 6a and 6b on the front and back surfaces of the printed wiring board 8 are connected through the through holes 7, a large amount of the heat transferred from the semiconductor devices 30 is almost uniformly diffused throughout the printed wiring board 8, thereby improving the heat radiation effect.

As a modification, it is of course possible to change the number of levels of the metal heat radiation plates 9 and the heat radiation fins and heat radiation grooves of the heat radiator 3. It is preferable for improve the heat radiation efficiency to increase the number of levels of the metal heat radiation plates 9 and the heat radiation fins and heat radiation grooves of the heat radiator 3.

After the metal heat radiation plates 9 have been adjusted in level or height by the metal height adjustment spacers 10, then the metal heat radiation plates 9 are fixed to the metal heat radiation pillars 5 by the screws 11 so that the metal heat radiation plates 9 push the heat radiator 3 downwardly whereby the metal bumps 31b bonding the chip size packages 1 and the chip size package mounting substrate 2 are free to receive thermal or mechanical tensile stress.

The above novel package structure can be assembled as follows. FIGS. 7A through 7D are cross sectional elevation views illustrative of the novel package structure with the heat transfer structure for the multi-chip module.

Figure 7A:
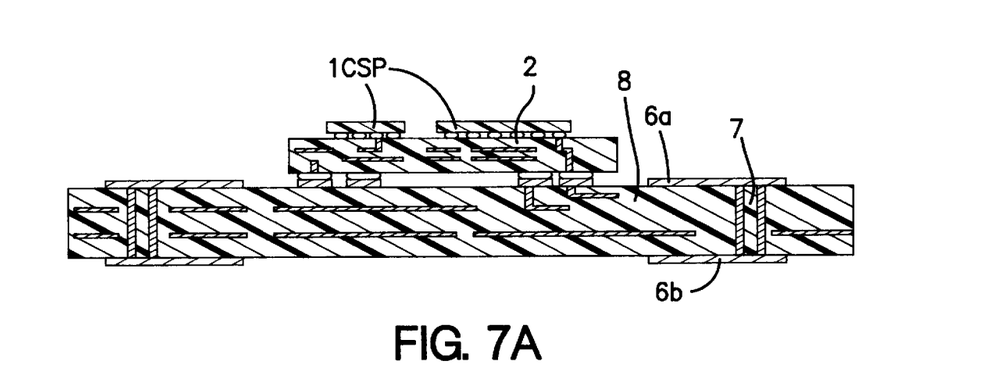
FIGS. 7A through 7D are cross sectional elevation views illustrative of the novel package structure with the heat transfer structure for the multi-chip module.

With reference to FIG. 7A, the chip size packages 1 are bonded by the metal bumps 31b on the chip size package mounting substrate 2. The chip size package mounting substrate 2 is bonded by the metal bumps on the connection pads on the printed wiring board 8 to form the multi-chip module.

Figure 7B:
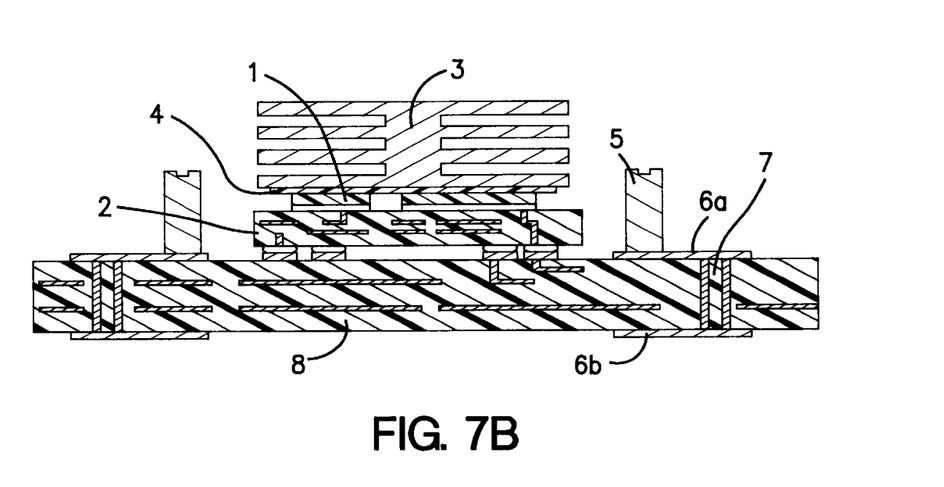

With reference to FIG. 7B, the heat conductivity sheet 4 is provided over the back surfaces of the plural chip size packages 1. The heat radiator 3 is provided on the heat conductivity sheet 4. The metal heat radiation pillars 5 are solder-bonded on the copper foil patterns 6a.

Figure 7C:
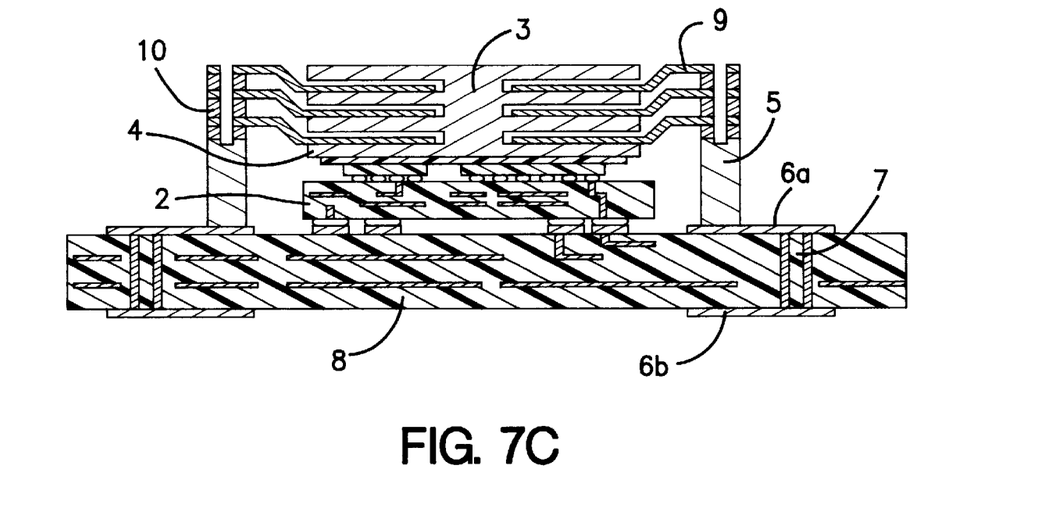

With reference to FIG. 7C, the metal heat radiation plates 9 are provided with adjustment by the height adjustment spacers 10 so that the metal heat radiation plates 9 are inserted into the heat radiation grooves 12 of the heat radiator 3 but the metal heat radiation plates 9 are in contact with upper surfaces of the heat radiation fins of the heat radiator 3.

Figure 7D:
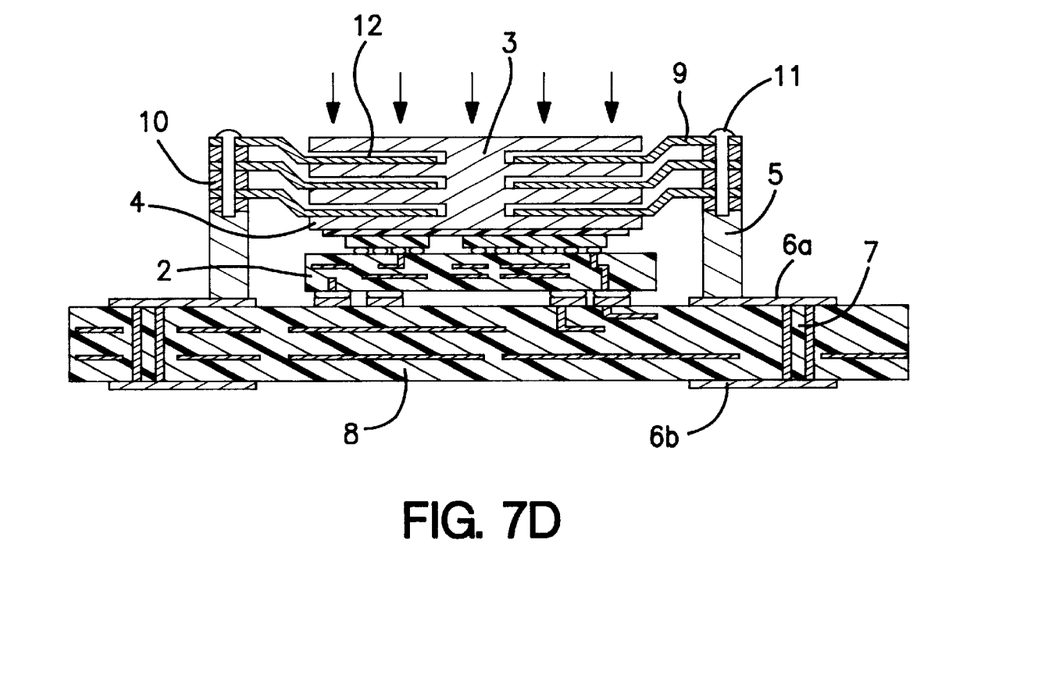

With reference to FIG. 7D, the metal heat radiation plates 9 are fixed to the metal heat radiation pillars 5 by the screws 11 so that the metal heat radiation plates 9 push the heat radiator 3 downwardly.

As a modification, it is possible to further provide a micro-fun for improvement in heat radiation efficiency.

As a further modification, it is of course possible to change the number of levels of the metal heat radiation plates 9 and the heat radiation fins and heat radiation grooves of the heat radiator 3. It is preferable for improve the heat radiation efficiency to increase the number of levels of the metal heat radiation plates 9 and the heat radiation fins and heat radiation grooves of the heat radiator 3.

The above novel package structure has three heat transfer routes. Namely, in the first heat transfer route, the heat generated from the semiconductor devices 30 is transferred through the heat conductivity sheet 4 to the metal heat radiator 3 for subsequent heat radiation to atmosphere. In the second heat transfer route, the heat generated from the semiconductor devices 30 is transferred through the heat conductivity sheet 4 to the metal heat radiator 3 and then further transferred through the metal heat radiation plates 9 and the metal heat radiation pillars 5 to the printed wiring board 8. In the third heat transfer route, the heat generated from the semiconductor devices 30 is transferred through the carrier substrates 32 and the metal bumps 31b to the chip size package mounting substrate 2 and then further transferred through the bumps to the printed wiring board 8.

Since the printed wiring board 8 has a large total area of the copper foil patterns which have the high heat conductivity, then the printed wiring board 8 has a heat conductivity which is higher by several tens time than a heat conductivity of the glass epoxy resin printed wiring board, for which reason it is effective to take place the heat radiation through the printed wiring board 8. Since, further, the copper foil patterns 6a and 6b on the front and back surfaces of the printed wiring board 8 are connected through the through holes 7, a large amount of the heat transferred from the semiconductor devices 30 is almost uniformly diffused throughout the printed wiring board 8, thereby improving the heat radiation effect.

After the metal heat radiation plates 9 have been adjusted in level or height by the metal height adjustment spacers 10, then the metal heat radiation plates 9 are fixed to the metal heat radiation pillars 5 by the screws 11 so that the metal heat radiation plates 9 push the heat radiator 3 downwardly whereby the metal bumps 31b bonding the chip size packages 1 and the chip size package mounting substrate 2 are free to receive thermal or mechanical tensile stress.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor package structure comprising:
    a printed board having a first surface on which a plurality of first heat-conductive patterns are provided and a second surface on which a plurality of second heat-conductive patterns are provided, said printed board having heat-conductive through holes connecting said first and second heat-conductive patterns;
    a multi-chip module having a plurality of semiconductor packages and being provided on said first surface of said printed board;
    a plurality of heat-conductive supporting members provided on said first heat-conductive patterns;
    a heat radiator structure having at least two heat radiation fins and at least a heat radiation groove defined by said heat radiation fins, said heat radiator structure being provided on said multi-chip module; and
    a plurality of heat conductivity plate-shaped members fixed to said heat-conductive supporting members and inserted into said heat radiation groove so that said heat conductivity plate-shaped members are in contact with upper surfaces of said heat radiation fins,
    wherein a first heat transfer route is formed for transferring a heat generated in said multi-chip module through said heat radiator structure to atmosphere surrounding said heat radiator structure,
    wherein a second heat transfer route is formed for transferring said heat through said heat radiator structure, said heat conductivity plate-shaped members, said heat-conductive supporting members and said first heat-conductive patterns to said printed board and also to said through holes which are heat-conductive to said second heat-conductive patterns, and
    wherein a third heat transfer route is formed for transferring said heat to said printed board.

2. The semiconductor package structure as claimed in claim 1, further comprising a heat-conductive sheet between said multi-chip module and said heat radiator structure.

3. The semiconductor package structure as claimed in claim 1, wherein said heat conductivity plate-shaped members are capable of providing a spring force so that said heat conductivity plate-shaped members push said heat radiator structure downwardly.

4. The semiconductor package structure as claimed in claim 3, wherein said heat conductivity plate-shaped members have bent portions providing said spring force.

5. The semiconductor package structure as claimed in claim 1, further comprising spacers provided on said heat-conductive supporting members for adjusting positional levels of said beat conductivity plate-shaped members so that said heat conductivity plate-shaped members push said heat radiator structure downwardly.

6. A semiconductor device comprising:
    a printed board having a first surface on which a plurality of first heat-conductive patterns are provided and a second surface on which a plurality of second heat-conductive patterns are provided, said printed board having heat-conductive through holes connecting said first and second heat-conductive patterns;
    a multi-chip module having a plurality of semiconductor packages and being provided on said first surface of said printed board;
    a plurality of heat-conductive pillars provided on said first heat-conductive patterns;
    a heat radiator having at least two heat radiation fins and at least a heat radiation groove defined by said heat radiation fins, said heat radiator being provided on said multi-chip module; and
    a plurality of heat conductivity plates fixed to said heat-conductive pillars and inserted into said heat radiation groove so that said heat conductivity plates are in contact with upper surfaces of said heat radiation fins,
    wherein a first heat transfer route is formed for transferring a heat generated in said multi-chip module through said heat radiator to atmosphere surrounding said heat radiator,
    wherein a second heat transfer route is formed for transferring said heat through said heat radiator, said heat conductivity plates, said heat-conductive pillars and said first heat-conductive patterns to said printed board and also to said through holes which are heat-conductive to said second heat-conductive patterns, and
    wherein a third heat transfer route is formed for transferring said heat to said printed board.

7. The semiconductor device as claimed in claim 6, further comprising a heat-conductive sheet between said multi-chip module and said heat radiator.

8. The semiconductor device as claimed in claim 6, wherein said heat conductivity plates are capable of providing a spring force so that said heat conductivity plates push said heat radiator structure downwardly.

9. The semiconductor device as claimed in claim 8, wherein said heat conductivity plates have bent portions providing said spring force.

10. The semiconductor device as claimed in claim 6, further comprising spacers provided on said heat-conductive pillars for adjusting positional levels of said heat conductivity plates so that said heat conductivity plates push said heat radiator structure downwardly.

* * * * *